United States Patent
Petersen et al.

(10) Patent No.: US 7,557,489 B2
(45) Date of Patent: Jul. 7, 2009

(54) EMBEDDED CIRCUITS ON AN ULTRASOUND TRANSDUCER AND METHOD OF MANUFACTURE

(75) Inventors: David A. Petersen, Fall City, WA (US); Stephen C. Englund, Bellevue, WA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 0 days.

(21) Appl. No.: 11/827,179

(22) Filed: Jul. 10, 2007

(65) Prior Publication Data

US 2009/0015101 A1 Jan. 15, 2009

(51) Int. Cl.
*H04R 17/00* (2006.01)

(52) U.S. Cl. .................. 310/334; 310/311; 367/155; 367/157

(58) Field of Classification Search ............... 310/334; 367/155, 157
See application file for complete search history.

(56) References Cited

U.S. PATENT DOCUMENTS

| | | | |
|---|---|---|---|
| 4,825,115 A * | 4/1989 | Kawabe et al. ............ 310/327 |
| 4,962,332 A * | 10/1990 | Rokurohta et al. .......... 310/335 |
| 5,329,498 A * | 7/1994 | Greenstein .................. 367/155 |
| 5,559,388 A | 9/1996 | Lorraine et al. |
| 5,997,479 A | 12/1999 | Savord et al. |
| 6,044,533 A | 4/2000 | Bureau et al. |
| 6,104,126 A * | 8/2000 | Gilmore ..................... 310/334 |
| 6,126,602 A | 10/2000 | Savord et al. |
| 6,324,907 B1 | 12/2001 | Halteren et al. |
| 2004/0016996 A1 * | 1/2004 | Tang .......................... 257/678 |
| 2005/0237858 A1 * | 10/2005 | Thomenius et al. ......... 367/155 |
| 2006/0035481 A1 | 2/2006 | Petersen et al. |

\* cited by examiner

*Primary Examiner*—Quyen Leung
*Assistant Examiner*—Bryan P Gordon

(57) ABSTRACT

One or more chips, integrated circuits, or semiconductors are embedded within a backing block. Planar sheets of backing material are formed with integrated circuits within holes in the sheets. Traces connect the integrated circuit to electrodes or exposed conductive surfaces. A plurality of the planar sheets may be manufactured using wafer processing, such as pick and place of chips in a wafer of backing material and IC redistribution for forming the traces. The different sheets are cut from the wafer and stacked adjacent each other. The transducer connects with the exposed electrodes or conductive surfaces of the backing.

13 Claims, 17 Drawing Sheets

EMBEDDED CIRCUITS ON AN ULTRASOUND TRANSDUCER AND METHOD OF MANUFACTURE

BACKGROUND

The present embodiments relate to ultrasound transducers. In particular, a method of manufacture of backing is provided.

One-dimensional arrays of transducers connect with system channels by flex material. The flex material is aligned with elements of the array. Behind the elements and the flex is acoustic backing material. The acoustic backing material attenuates acoustic energy, limiting reflection of signals not from the tissue being scanned. The flex material is thin enough to avoid reflections.

For two-dimensional arrays, flex material may not provide sufficient conductor density. Alternatives have been proposed, such as z-axis conductors. The acoustic backing is formed with conductors extending along the range dimension through the backing material. However, alignment and holding of these conductors during formation of the backing material may be difficult. The density of the wires on the back of the backing material is still high, resulting in difficulty for connection.

A further problem is the number of cables to the ultrasound imaging system. To limit the number of cables, circuits are positioned in the ultrasound probe housing. The circuits connect with the elements, such as with z-axis conductors in the backing. The circuits combine signals from a plurality of elements, such as through partial beamforming or multiplexing. The combination reduces the number of cables needed to the imaging system. However, the interconnection of the electrodes of the elements to the circuitry may be difficult.

Each element of an array connects with two conductive paths. The conductive paths may include connections to circuits within a probe, connections from the circuits to the cable, and connections from the cable to beamformers in the imaging system. There may be thousands of interconnections within the circuits, thousands more for element-to-flex, thousands more for flex-to-circuit, and more from circuit-to-cable interconnections. The number of connections may be large, resulting in increased parasitics, increased chance of shorting, and required expensive manufacturing.

BRIEF SUMMARY

By way of introduction, the preferred embodiments described below include methods, backing, transducers, and systems for acoustically attenuating ultrasound energy. One or more chips, integrated circuits, or semiconductors are embedded within the backing.

In one embodiment, planar sheets of backing material are formed with integrated circuits within holes in the sheets. Traces connect the integrated circuit to electrodes or exposed conductive surfaces. A plurality of the planar sheets may be manufactured using wafer processing, such as pick and place of chips in a wafer of backing material and IC redistribution for forming the traces. The different sheets are cut from the wafer and stacked adjacent each other. The transducer connects with the exposed electrodes or conductive surfaces of the backing.

In a first aspect, an ultrasound transducer has transducer material forming a plurality of elements, electrodes on each of the elements, and an acoustically attenuating backing material. An integrated circuit is embedded in the acoustically attenuating backing material.

In a second aspect, a backing is provided for acoustic attenuation of energy from a backside of a transducer. Backing material has a first surface for contact with the backside of the transducer. A semiconductor has active circuitry and is within the backing material.

In a third aspect, a method is provided for creating a backing for an ultrasound transducer array. A sheet of acoustically attenuating material is formed. A chip is placed within the sheet. Conductors are formed from the chip to a line of the sheet.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

The number of connections along the conductive path for a given element may be decreased by using semiconductor type fabrication or embedded circuits in backing material. Sawing, dicing, and lamination are combined with semiconductor integrated circuit redistribution technology. Semiconductor type fabrication may allow for cheaper and denser interconnections, supporting high element counts.

In one embodiment, the processing creates single-element elevation width, multiple element azimuth length modules for a multi-dimensional array. Conductors from the embedded circuits are formed with photolithography or other integrated circuit technique, providing density redistribution from the circuitry input pitch to the element pitch. The modules may be laminated to create a full backing or transducer with backing.

Figure 1:
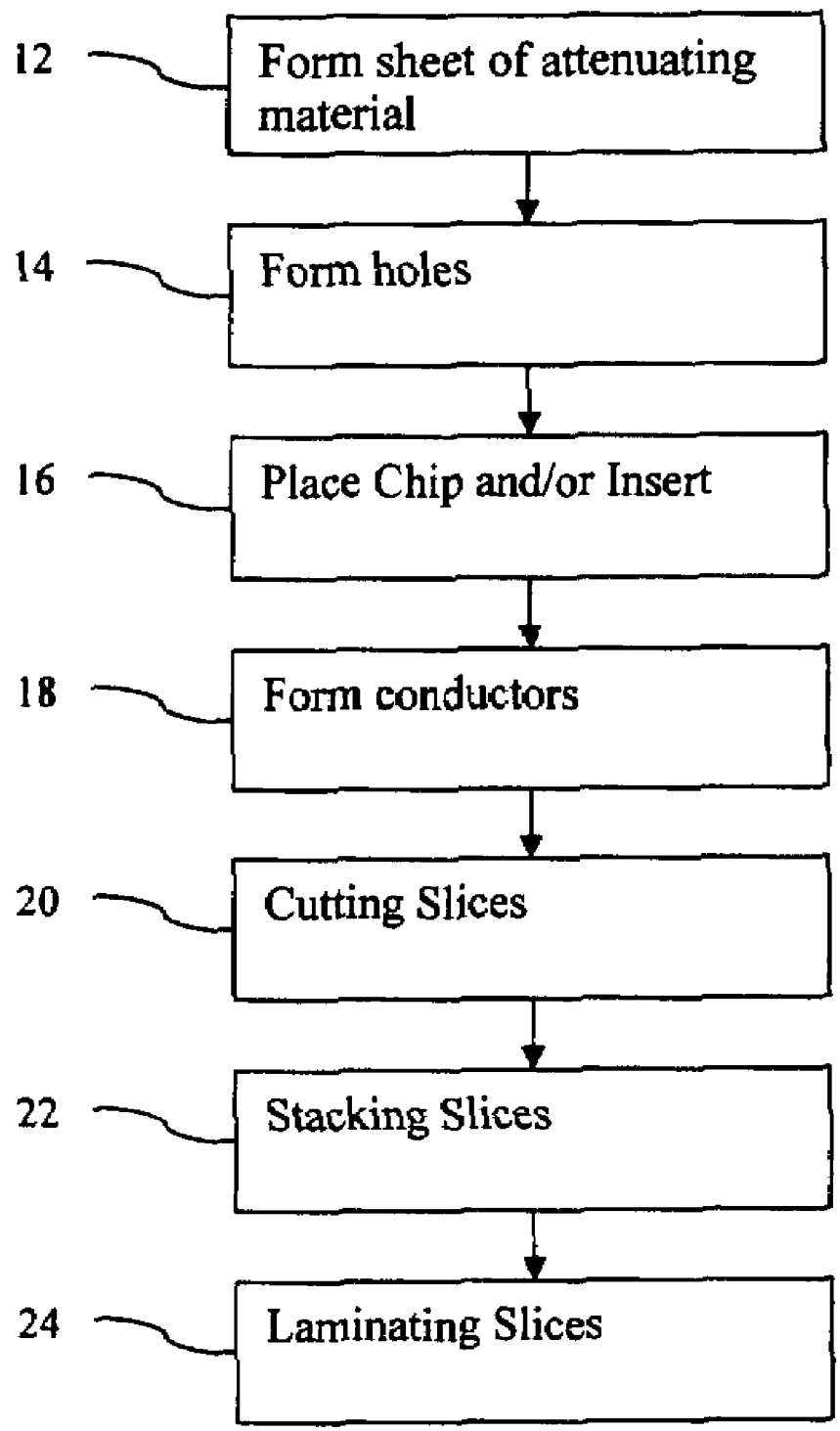
FIG. 1 is a flow chart diagram of one embodiment of a method for creating a backing for an ultrasound transducer array.

FIG. 1 shows a method for creating a backing for an ultrasound transducer array. The backing may be used with transducer material to form an ultrasound transducer. The backing is for operation with a multi-dimensional transducer array, but may operate with a one-dimensional array.

The method is performed in the order shown. Alternatively, a different order is provided. For example, the cutting slices act 20 is performed before or as part of the forming a sheet of act 12. Additional, different, or fewer acts may be provided. For example, the sheet is formed around the chip or inserts without needing to form holes in the sheet, such as by casting or molding.

Many embodiments are possible. FIGS. 2-8 show a wafer process type embodiment. FIGS. 9-12 show a block process embodiment. Both embodiments include some or all of the acts of FIG. 1. Other embodiments may be used, such as molding or casting the backing material around or adjacent multiple sides of one or more chips.

In act 12, a sheet 32 of acoustically attenuating material is formed. Casting, molding, deposition, or other process may be used. In one embodiment shown in FIG. 2, a boule 30 or cylinder of backing material is used. The boule is formed by molding loaded epoxy, such as tungsten-loaded epoxy. Other backing materials, including solids, polymers, semi-solids, or epoxies, may be used. No or different loading materials may be used. The density of the loading material or base backing material may vary, such as altering the acoustic attenuation from one side of the boule 30 to another side.

The sheet 32 is formed as a wafer. A wafer is sliced from the boule 30. The slicing is performed with a wafer saw, dicing saw, ID saw, or other wafer forming process. The thickness or height of the wafer is about an element pitch. For example, the backing is for use with a multi-dimensional array having a 400 micron element pitch in elevation. The wafer is sliced to be about 400 microns, such as 360-420 microns. Other thicknesses may be used, including a height greater than one, two, or more element spacings in elevation or azimuth. The wafer may be cut to greater than required thickness and then ground to specification after cutting from the boule 30. The sheet 32 is positioned on wafer tape or other wafer holder.

Figure 2:
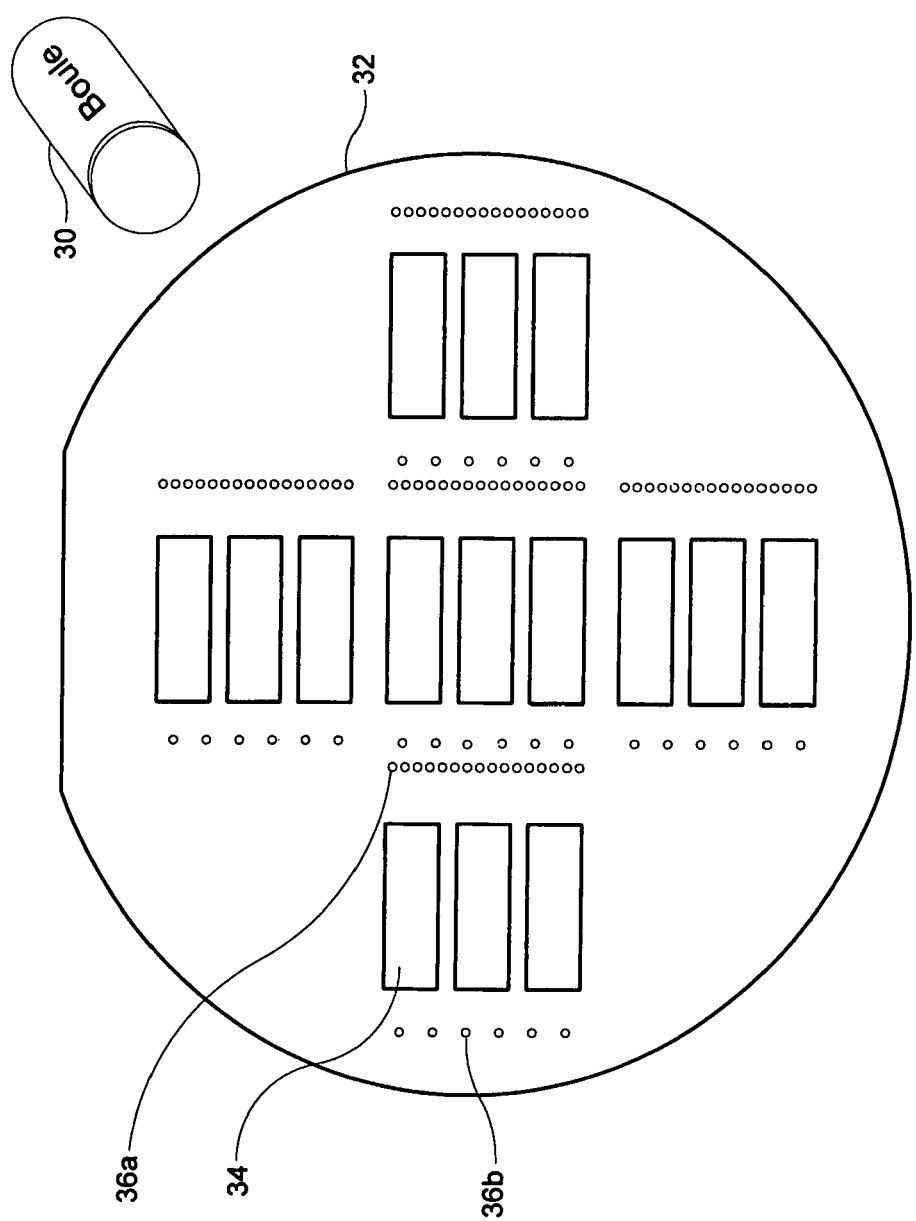
FIGS. 2 and 3 show alternative approaches for forming a sheet in a wafer embodiment.

In the embodiment shown in FIG. 2, the boule 30 is formed with a plurality of wires 36 extending from the top to the bottom or within the boule 30. The wires 36 are gold, copper, flex material with traces, or other conductors. The wires 36 are distributed in a plurality of patterns. Each pattern corresponds to one slice 50 to be used for a row of elements 58 (not shown). FIG. 2 shows the sheet 32 with five slices 50 of backing. One set of wires 36a for each slice is at an element pitch, such as an elevation or azimuth pitch. One wire 36a is provided for each element of the row to be used with the slice 50. Another set of wires 36b for each slice 50 is at a pitch for connection to cables or other electronics, such as a system interconnect PC board 60 (not shown).

When the sheet 32 is formed as a wafer, the slicing of the boule 30 also slices the wires 36. The wires 36 extend through the sheet 32.

Figure 3:
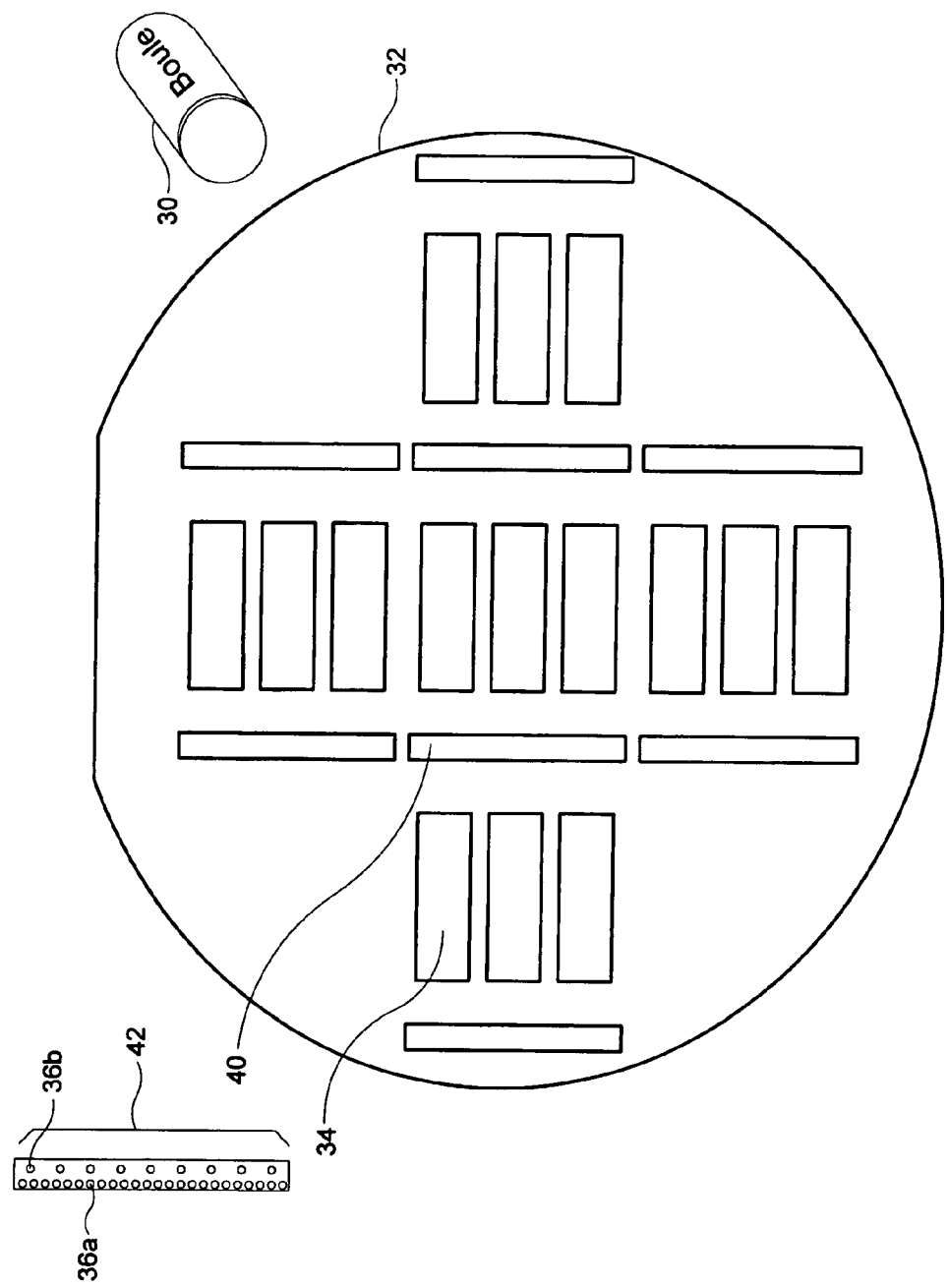

In an alternative embodiment shown in FIG. 3, the boule 30 does not include the wires 36. Instead, the boule 30 has no additional components. Other additions than wires may be provided. Instead of the wires 36 in the boule 30, inserts 42 may be used. The inserts 42 are formed of backing material, such as the same or different backing material used for the boule 30. Other materials may be provided, such as a plastic, semiconductor, or epoxy. The inserts 42 include conductors, such as wires 36a, 36b, patches, balls, or electrodes. The conductors extend into but not all the way through the insert 42. Alternatively, the conductors extend all the way through the insert 42. The insert 42 has a thickness the same as or similar to thickness of the sheet 32, such as a little less.

The conductors have the spacing discussed above for the wires 36. The conductors on a given insert 42 are for different slices 50. When slicing the sheet 32, the cuts extend through the insert 42, separating and exposing the different conductors. Alternatively, different inserts 42 are provided for different slices 50. Multiple inserts 42 may be used where one is shown. One insert 42 may be used where two or more are shown, such as an insert 42 extending along three slice sections of the sheet 32.

In act 14, holes 34, 40 are formed in the sheet 32. The holes 34, 40 are die-punched. Other techniques for forming the holes may be used. For example, the holes are formed by molding, cutting, casting, or etching. In one embodiment, the holes 34, 40 are in the boule 30. In other embodiments, the holes 34, 40 are formed in the sheet 32.

The holes 34 are sized for a chip 44 (not shown). The holes 34 extend through the sheet 32, but have a shape and dimensions the same or slightly larger than a chip 44. The holes 40 are sized for inserts 42. Where different sized inserts 42 are used, different sized holes 40 are used. The holes are positioned and oriented based on the slices 50 to be formed from the sheet 32. Other relative positions and orientations than shown may be used.

Figure 4:
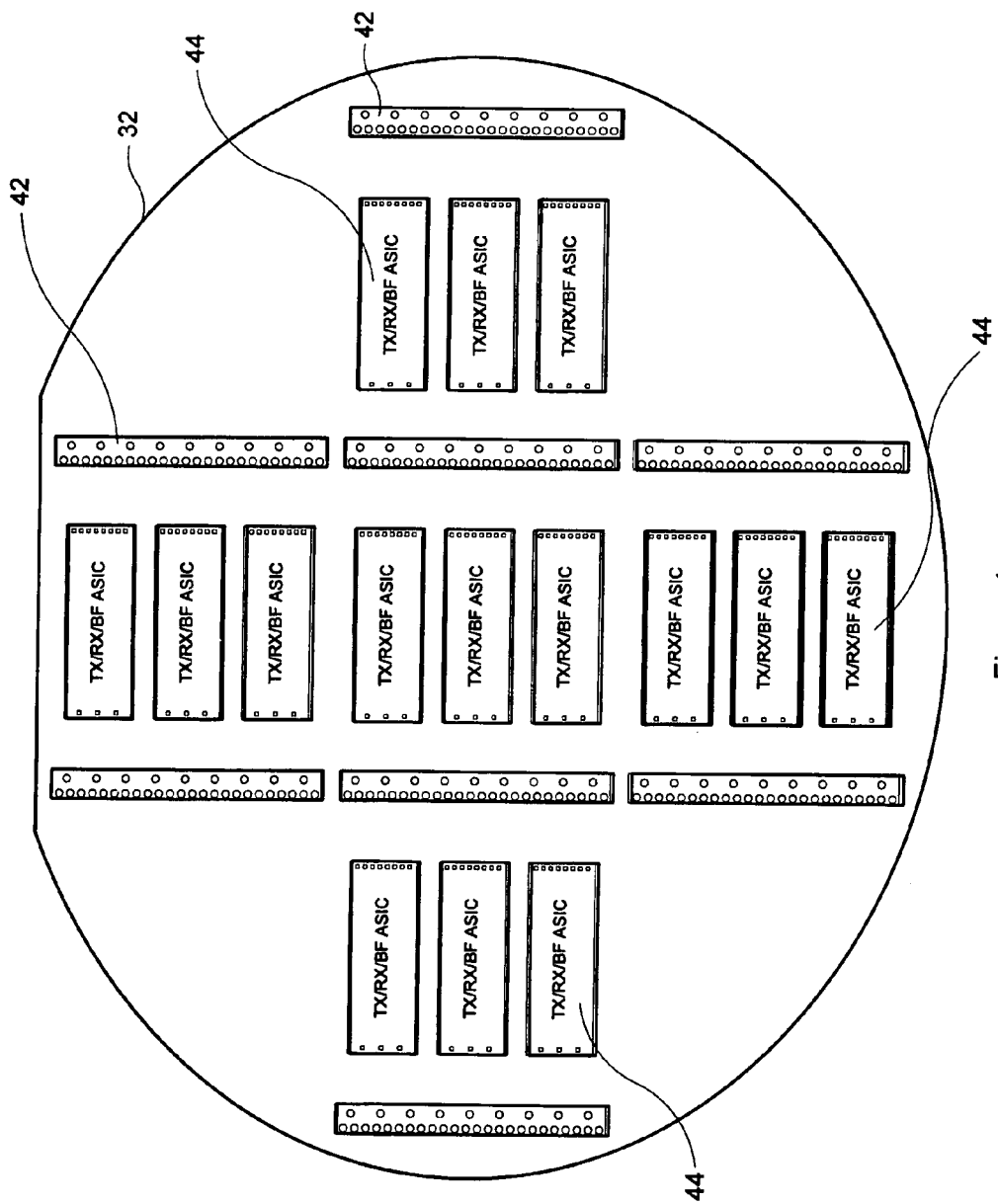
FIGS. 4-8 show processing steps and structure for the wafer embodiment.

In act 16, one or more chips 44 are placed within the sheet 32. FIG. 4 shows one example where three chips 44 are positioned in each region associated with a slice 50. Fewer or more chips 44 per slice 50 or per sheet 32 may be used. Inserts 42 are also placed within the sheet 32. Fewer or more inserts 42 per slice 50 or per sheet 32 may be used.

The chips 44 and inserts 42, if any, are placed by pick and place processing. The chips 44 are positioned with the active components down, for sticking to or protection by the wafer tape or holder. The active surface is provided in the same plane as the bottom of the sheet 32. The chip active surface may be optionally coated with a protective layer that is later removed or etched during the redistribution process. Other now known or later developed process for placing the chips 44 and inserts 42 in the holes 34, 40 may be used. Automated or manual placement may be used.

The chips 44 and/or inserts 42 have a thickness greater than, equal to, or less than the thickness of the sheet 32. For example, the thickness of the chips 44 and inserts 42 is about the same, but less by 5-10%. The chips 44 and inserts 42 do not extend out of the holes 34, 40. The remaining portions of the holes 34, 40 are filled with epoxy for backfilling. Squeegeeing or other process is used to provide a flat surface across the top of the sheet 32. Since the active surface of the chips 44 is positioned downward, the epoxy likely does not contact the active surface. Alternatively, the chips 44 and/or inserts 42 extend out of the holes 34, 40 and are lapped, ground, or etched away to from a planar surface with the sheet 32. Backfilling may be provided to fill any gaps.

The backfill material cures, forming a composite sheet 32. Once cured, the sheet 32 may be removed from the frame, tape, or other holder. In other embodiments, further processes occur before removal.

Figure 5:
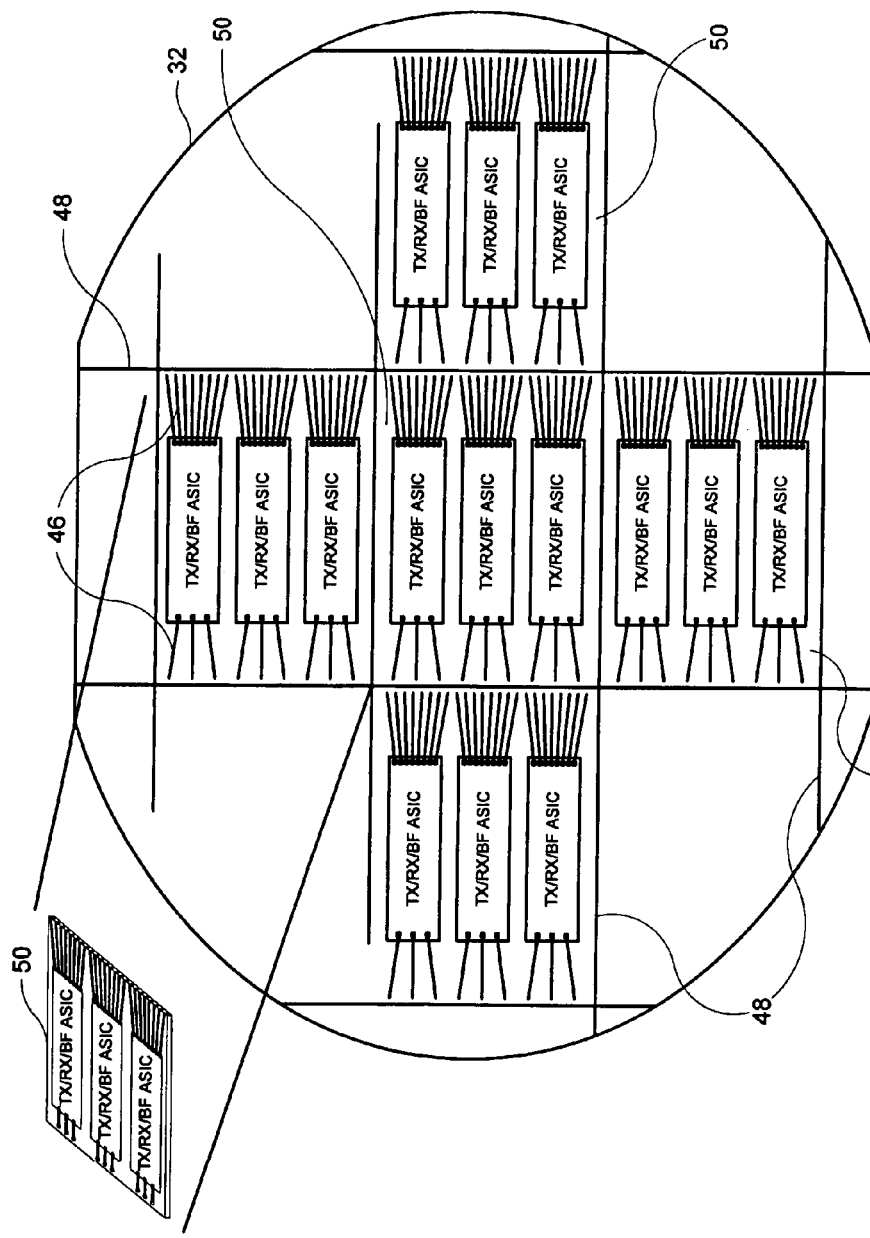

In act 18, conductors 46 are formed from the chips 44 to lines 48 of the sheet 32 (see FIG. 5). The lines 48 corresponded to edges of the slices to be cut from the sheet 32. The lines 48 are aligned with the inserts 42 or wires 36a, 36b to expose the wires 36a, 36b or conductive surfaces when the cut is made. The conductors 46 connect with pads, solder balls, or other conductors on the chips 44 and the wires 36 of the element and output conductive surfaces. The conductors 46 extend from the chip, over any filler, over the acoustic backing material, and onto the wires 36 or conductive surfaces.

The conductors 46 are formed by deposition, photolithography, etching, plating, and/or other semiconductor process. For example, planar IC redistribution processing is used. The conductors 46 are patterned for the different slices 50 of the sheet 32. While shown on the sheet 32, the conductors 46 may be provided within a layered sheet 32.

Since different arrays and/or chips 44 may have different connection configurations or pitch, the conductors 46 are patterned to match the differences. For example, the pitch of inputs of the chip 44 is smaller than the pitch of the elements 58 to be connected to the chip 44, so the conductors 46 fan apart. Other redistribution may be used. The redistribution allows use of module chips with different arrays.

For electrical or mechanical protection, the sheet 32 may be coated with an insulator. For example, the entire sheet 32 is spin coated. The coating is on the upward surface, downward surface, or both. In alternative embodiments, no coating is provided.

In act 20, one or more slices 50 are cut from the sheet 32. The cut is a dice, such as with a diamond saw, or other semiconductor cutting technique. The cuts are along the lines 48. The cuts expose the conductors along the lines 48, such as the wires 36 of the inserts 42. The exposed conductors have an area for contact with electrodes, other conductors, or elements of the transducer. In alternative embodiments, the cuts do not expose the wires 36, and the wires 36 are later exposed by grinding.

Each slice 50 includes one or more chips 44, the redistribution conductors 46, and exposed edge surface conductors 52. In the example shown in FIG. 5, each slice includes three chips 44. The conductors 46 connect the exposed edge surface conductors 52 to the inputs of the chips 44 and the output of the chips 44 to other exposed edge surface conductors 52.

The slices 50 are sized for positioning adjacent an array. For example, each slice 50 is sized to cover an entire azimuth row of elements but only one column of elevation elements. The chips 44 are spaced from the element side of the slice 50 by sufficient distance to provide the desired acoustic attenuation, such as about 5-10 millimeters. Any distances may be provided from the chips 44 to other edges, including one or more edges of the chip 44 not being covered by backing material of the sheet 32.

Figure 6:
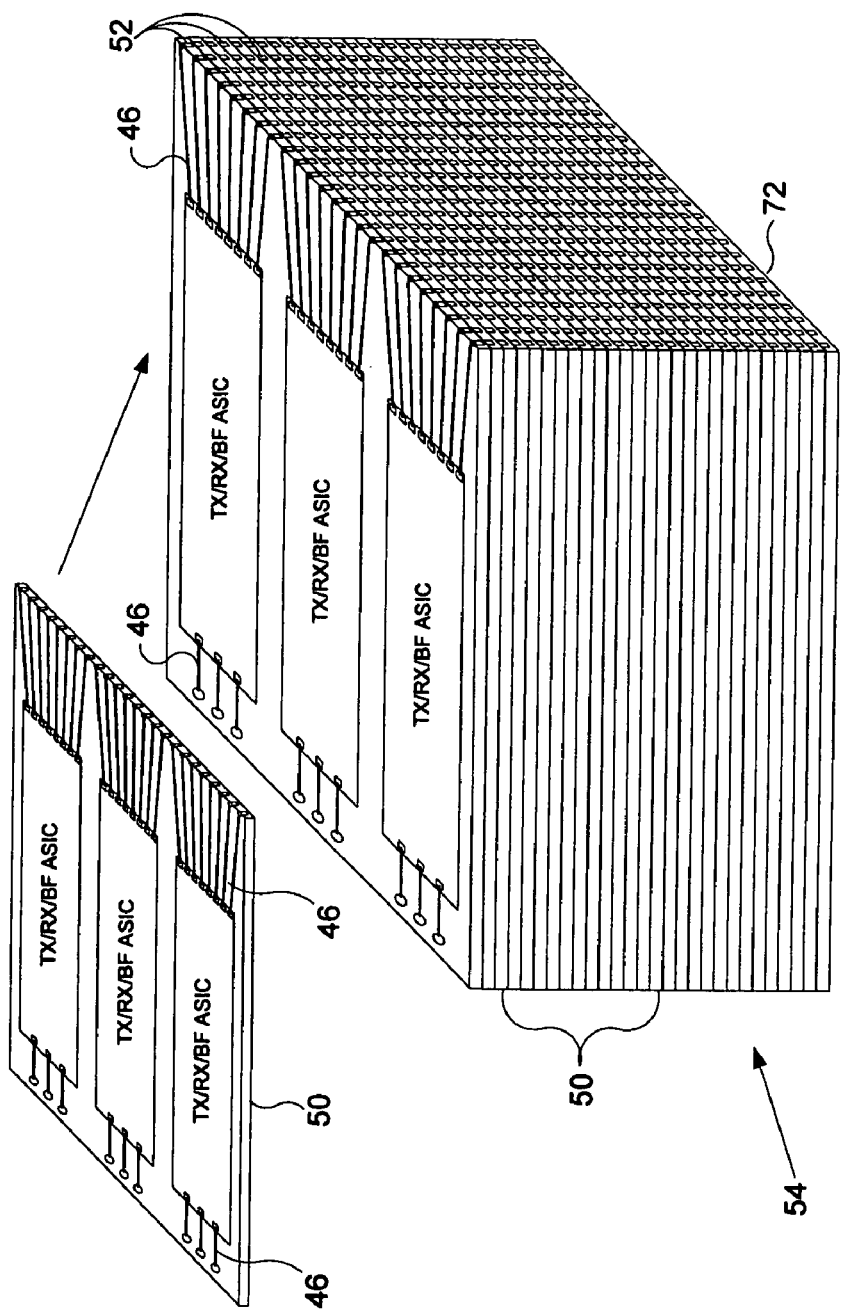

In act 22, a plurality of slices 50 are stacked together. FIG. 6 shows a stack forming a backing block 54. Fiducials, a frame, or other structure aligns the slices 50. The insulation coating, epoxy, or backing material insulates conductors of one slice 50 from other slices 50.

The backing block 54 provides a surface of exposed element contacts 52, such as from the exposed wires 36*a*. Alternatively, the backing block 54 is ground to expose the element contacts 52. The element contacts 52 are electrically isolated from each other by backing material and/or insulation material. The element contacts 52 are distributed on the surface in correspondence with the element distribution of the transducer. Each element contact 52 may be used as an electrode of an array or for connecting with the element electrodes. Where each slice 50 corresponds to a single row of elements 58 in one dimension, a sufficient number of slices 50 are provided for the number of elements 58 in the other dimension. Slices 50 with exposed element contacts 52 for two or more rows may be used. Slices 50 extending less than an entire width of the array may be used.

The stacked slices 50 are laminated together in act 24. Heat or other activator may be used for lamination. Epoxy or other binding agent may be used. In an alternative embodiment, a rigid structure or clamp holds the stack 54 together during use.

Figure 7:
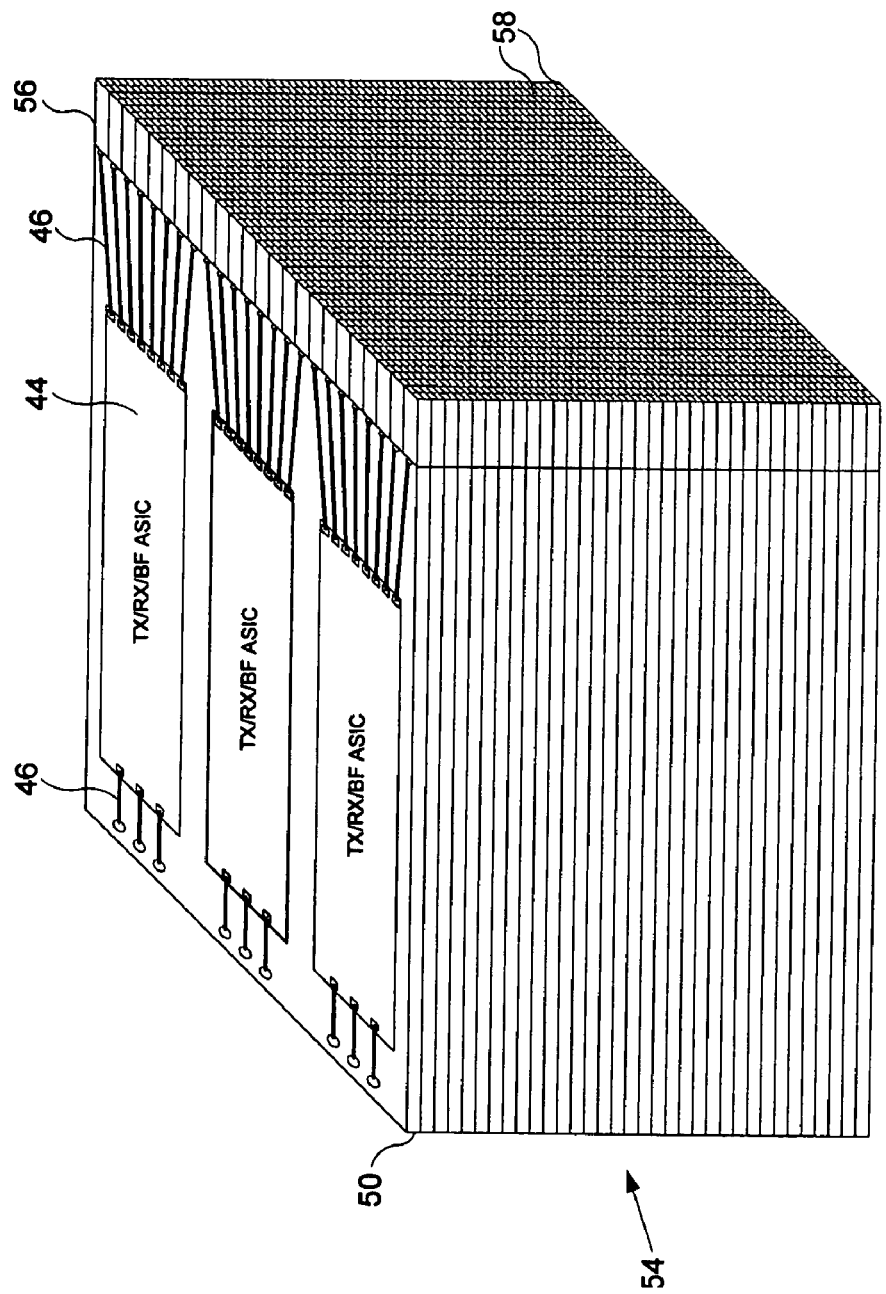

FIG. 7 shows adding a layer of transducer material 56. The layer of transducer material 56 is a solid piezoelectric ceramic, composite, or other transduction material. The layer may include electrodes and/or matching layers. In one embodiment, the layer is bonded to the backing block 54, and then elements 58 are formed by dicing. Sub-elements may also be formed. In other embodiments, the elements 58 are formed prior to bonding to the backing stack 54. The elements 58 and corresponding kerfs align with the element contacts 52. A grounding plane may be included above or below any matching layers for grounding the top side of the elements 58.

Figure 8:
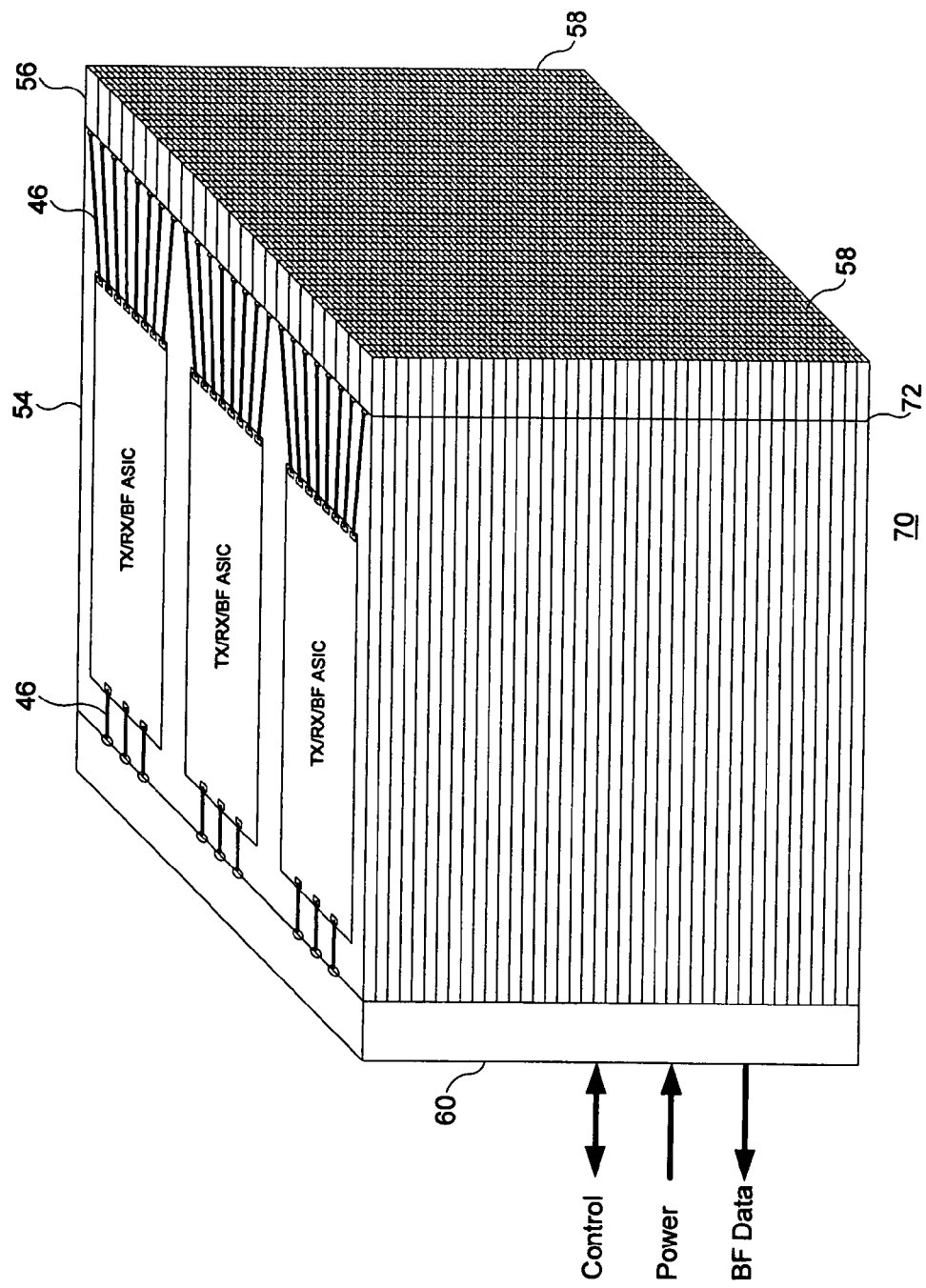

FIG. 8 shows connection of a system interconnect board 60. The backing block 54 is ground to expose system side conductive surfaces 52 on a back of the backing block 54. Alternatively, the slicing of act 20 exposes the conductive surfaces 52. The surfaces 52 are arranged on the backing block 54 to mate with conductors in the board 60, such as using flip chip type soldering. The interconnect board 60 is bonded, pressed, or otherwise connected with the backing block 54. By alignment, the conductors of the board 60 connect with the conductors of the backing block 54 output by the chips 44.

Figure 17:
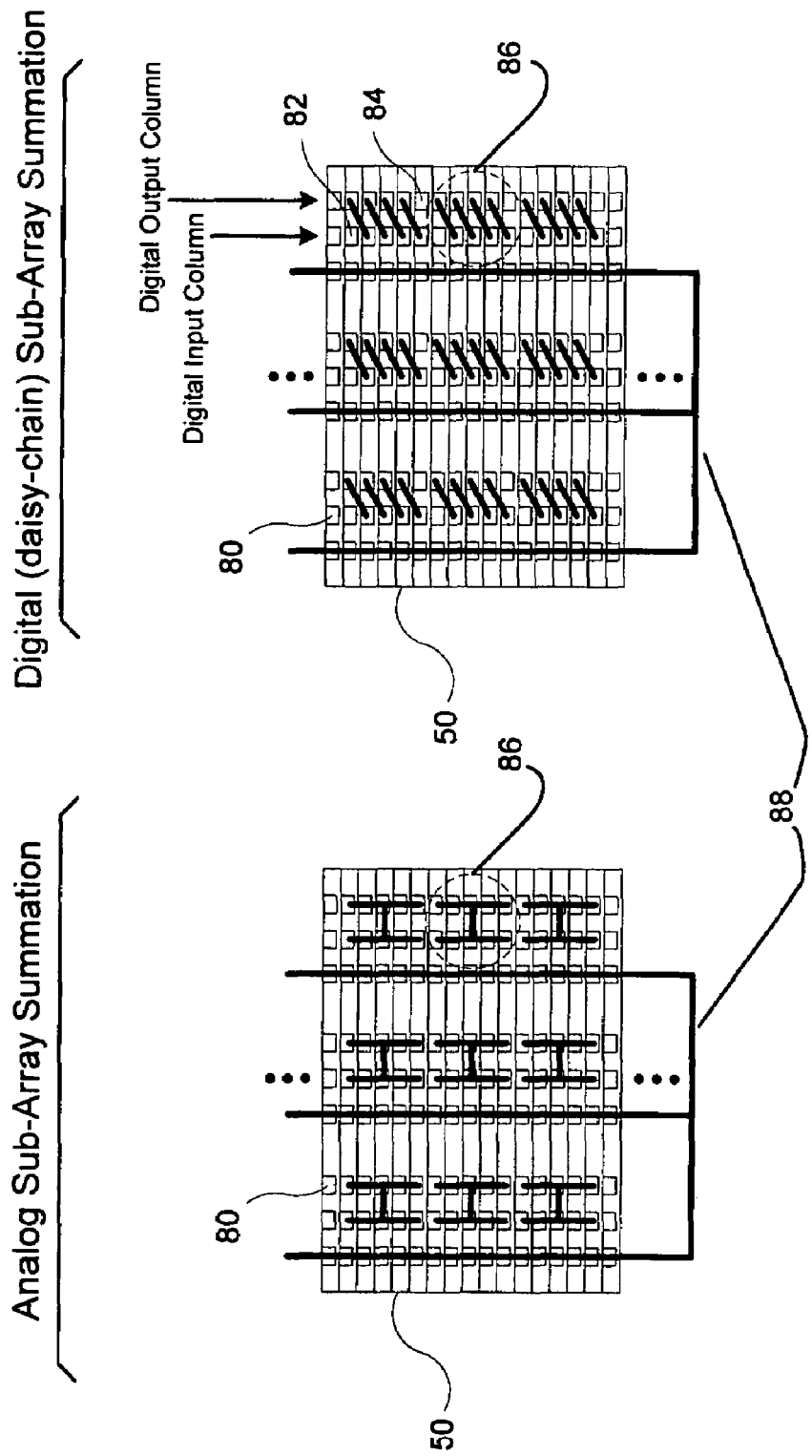
FIG. 17 shows alternative embodiments of interconnects between backing slices of a transducer array.

FIG. 17 shows different embodiments of connections for the interconnect board 60. One embodiment is for analog connections and another is for digital signal connections. Other analog, digital, or both connections may be used. The slices 50 are shown stacked from the back-side associated with connection to the interconnect board 60. The contacts 80 connect the board 60 to the chips 44. For digital implementation, pairs of contacts 80 from different slices 50 are connected together in a daisy chain or other formats. One row represents an input for the portion of the slice 50 handled by a chip 44 and another row represents an output for the portion of the slice 50 handled by the chip 44. Each output is a partial or sub-array summation (e.g., summed in azimuth but not elevation). The input from another slice may be summed with the output, providing for sub-array summation in azimuth and elevation. The contact 82 for a given sub-array floats or is grounded. Another contact 82 is the output to the system. For the analog embodiment, each contact 80 is a partial sub-array (e.g., summed in azimuth but not in elevation). Groups of contacts 80 are connected together to form a sub-array (e.g., represented by the "H" configuration). The complete sub-array signals are wired to the system. Other contacts 88 are used for power, grounding, and/or control signals. These contacts 88 are shown as only one per chip 44, but more may be provided. The interconnect board 60 provides the wires for the daisy chain, "H" connections, and/or power/ground/control connections. Other configurations may be used.

The chips 44 reduce the channel count for each given slice 50. Multiplexing, sub-array mixing, partial beamformation, combinations thereof, or other techniques for channel reduction may be used. The input element data is combined onto fewer outputs. The output data is analog or digital. The output data is provided to the interconnect board 60. The interconnect board 60 is a PC board of insulating material with signal traces and/or vias. Active or passive circuits may or may not be provided on the interconnect board 60. For example, capacitors are provided for power storage or DC decoupling.

The interconnect board 60 connects the outputs of the chips 44 to cables, such as coaxial cables connected to the interconnect board 60. Control signals, power, and/or transmit waveforms may be provided through or by the interconnect board 60 to the chips 44 using one or more conductors 46. The interconnect board 60 may provide signals from one slice 50 to a chip 44 of another slice 50, such as for performing further channel reduction. For example, partial beamforming is provided by combining signals from different elevation rows of elements.

Figure 9:
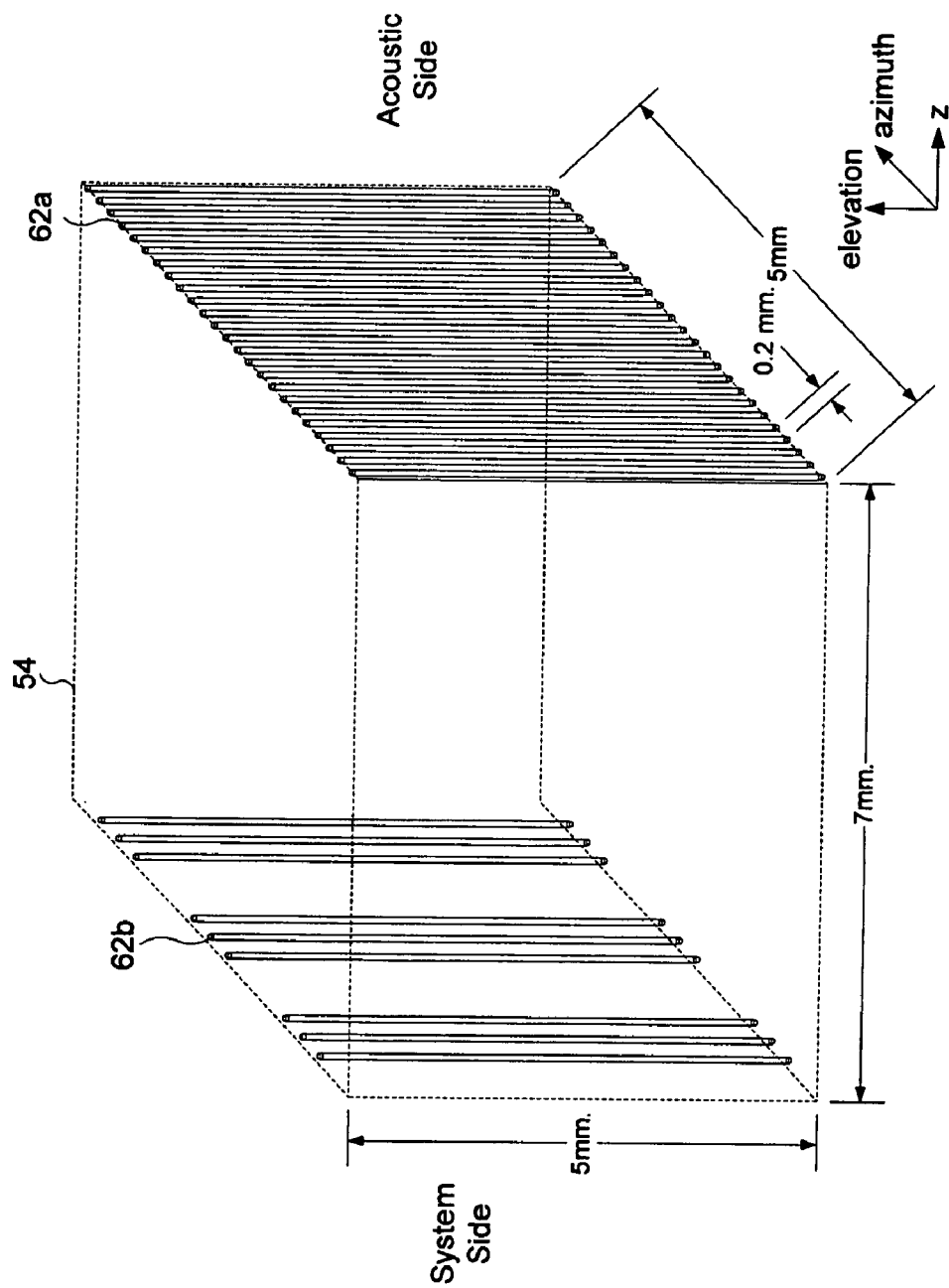
FIGS. 9-12 show processing steps and structure for an alternative block embodiment.

FIGS. 9-12 show an alternative embodiment for implementing the method of FIG. 1. The sheet of backing material is formed from a block in act 12. FIG. 9 shows a block 54 of backing material sized and shaped for operating with a multi-dimensional transducer array. Other sizes than shown may be used, such as having larger dimensions along the height due to the later described cutting. The block 54 is loaded epoxy, but other acoustic attenuating materials may be used.

The block 54 includes a plurality of wires 62. The wires 62*a* are on the acoustic or transducer side. The wires 62*b* are on the system side. As an alternative to wires 62, traces on flexible material or other conductors may be used. The wires 62*a* extend along the entire height of the block 54 and are spaced at an element pitch, such as 0.2 mm. The wires 62*b* on the system side extend along the entire height and are spaced as appropriate for system side connections between an interconnect board 60 and chips 44 (not shown) in the backing. Where the chips 44 (not shown) reduce the channel count, fewer wires 62*b* may be needed. The wires 62 are on the outer edge, but may be embedded within the block 54 for later exposure by grinding.

Figure 10:
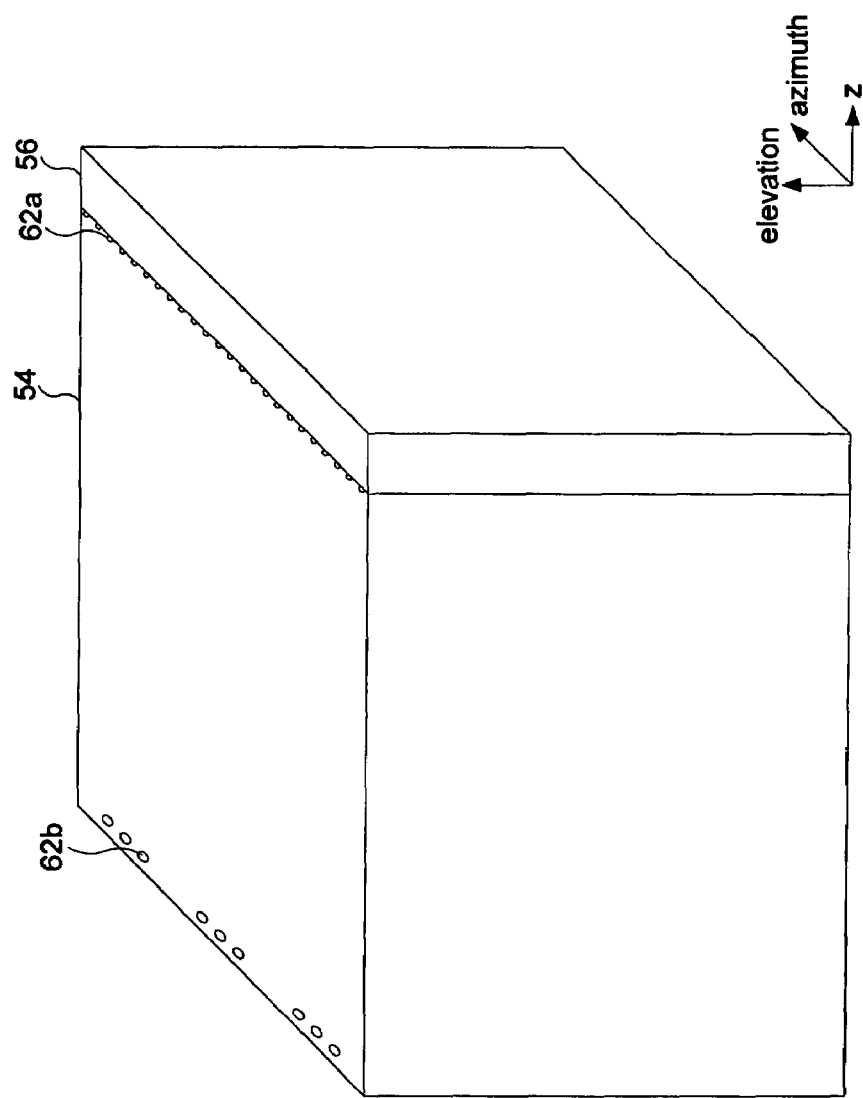
Figure 11:
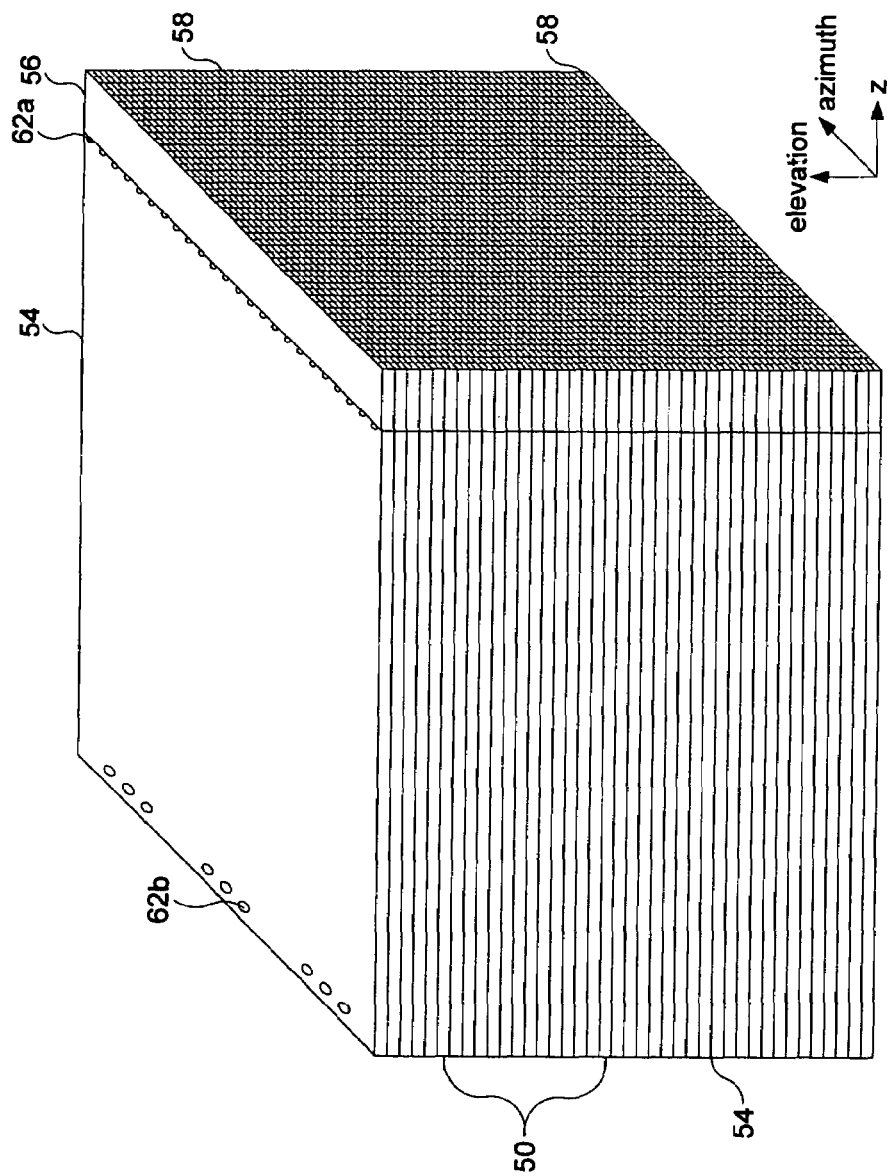

FIG. 10 shows adding a layer of transducer material 56 to the block 54. The acoustic side of the block 54 is ground to provide flat surfaces on the wires 62*a*. The transducer material 56 is bonded to or otherwise connected to the block 54.

Figure 12:
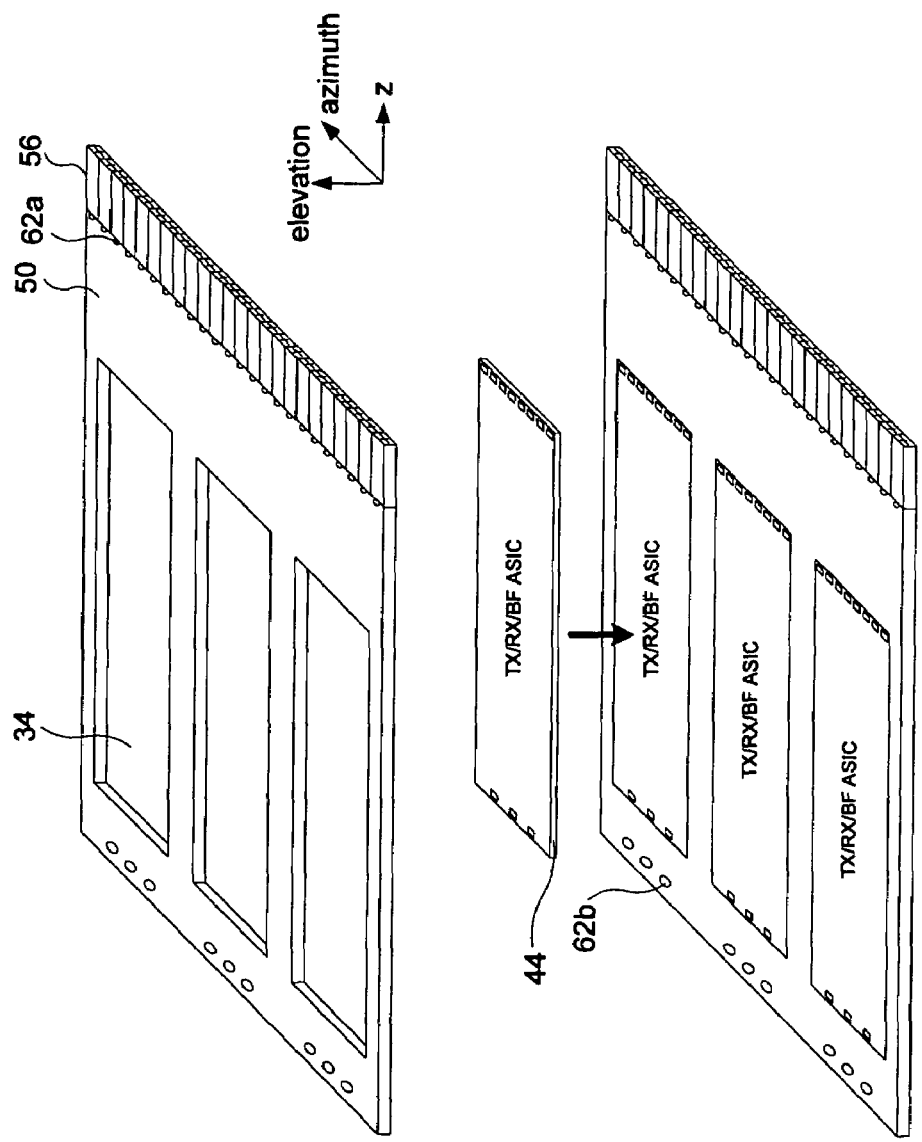

The transducer material 56 is diced to form elements and/or sub-elements. Some of the kerfs 64 extend through the transducer material 56 and the block 54, forming slices 50. The dicing is performed with a diamond grit ID saw, but other cutting devices may be used. The cutting severs the wires 62 in elevation while maintaining contact of the wires 62*a* with the elements 58 formed by dicing. FIG. 12 shows the resulting slices 50. The slices 50, unlike the embodiment of FIGS. 2-8, may include the transducer material 56 on each slice 50 before stacking. This method of construction does not require the transducer material 56 to be applied to each slice 50. The array of transducer material 56 may be attached as a whole piece at the end regardless of how the block 54 is constructed.

In acts 14 and 16 of FIG. 1, holes 34 are formed in the slices 50 and chips 44 are placed in the holes 34. Conductors are formed in act 18. Act 20 occurs with act 12. The slices 50 are stacked and laminated in acts 22 and 24.

Other embodiments may be provided for forming the slices 50. For example, slices are individually formed without cutting from a block or wafer.

FIG. 8 shows an ultrasound transducer 70. After stacking and laminating, the backing block 54 of attenuating material with embedded chips 44 is provided. The backing block 54 is used with transducer material 56 to provide the ultrasound transducer 70. The ultrasound transducer 70 includes the transducer material 56, electrodes on the elements 58, the backing block 54, and the interconnect board 60. Additional, different, or fewer components may be provided. For example, matching layers, a ground plane flex, a lens, a housing, coaxial cables, and/or a wireless transceiver are included. As another example, flex material with traces or a cable connector connect with the backing block 54 without the interconnect board 60.

The transducer material 56 is diced or formed into a plurality of elements 58. The elements 58 are spaced in a one, two, or other multi-dimensional array of elements 58. For a multi-dimensional array of elements 58, the elements 58 are spaced in a rectangular grid in elevation and azimuth. Other grids may be used. The elements 58 are single layer or multi-layer piezoelectric elements 58 with or without sub-dicing. Other types of transducer material (e.g., non-piezoelectric) are possible. After building the block 54, any type of transducer could be attached. For example, a CMUT with backside contact vias is attached to the block 54.

Each element 58 includes electrodes on opposite faces of the element 58. One electrode is positioned between the transducer material 56 and the backing block 54. The other electrode is on the side of the element 58 where acoustic signals are transmitted and received from the patient. The electrodes are deposited on the elements, formed by conductors on flex material (e.g., grounding plane on the side of the element for transmitting and receiving), formed by the wires 62, conductive surfaces 52, or other conductor of the backing block 54, or other technique. The electrodes adjacent the backing block 54 are electrically isolated from each other, such as by dicing into a pattern matching the element pattern.

The backing block 54 is for acoustic attenuation of energy from a backside of the transducer 70. Acoustic energy going through the transducer material 56 or propagating from the transducer material 56 away from the patient is attenuated. The attenuation limits or avoids reflections of acoustic energy large enough to generate undesired interference in the electrical signals generated by transduction. The backing block 54 prevents or limits signal contribution by echoes not from the patient.

The backing block 54 is any now known or later developed material for attenuating at a desired acoustic frequency, such as 1-20 MHz. The backing block 54 includes a solid or composite material for attenuation. The material may be moldable, castable, and/or machinable. In one embodiment, a composite material of epoxy and one or more fillers, such as tungsten, is used.

The backing block 54 includes the surface 72 for contact with the backside of the transducer material 54. The surface 72 includes a plurality of spaced apart or electrically isolated, exposed conductors 52 for connection with the electrodes and/or elements 58. Alternatively, the electrical isolation is provided by dicing.

The backing block 54 includes one or more semiconductors, such as the chips 44. The semiconductors include active circuitry, such as transistors. In one embodiment, the semiconductor is an application specific integrated circuit, but other integrated circuits may be used (e.g., a general processor). The semiconductor reduces the number of channels of information to be communicated to an imaging system. Any reduction technique may be used. For example, the semiconductor multiplexes using time and/or frequency multiplexing. As another example, the semiconductor includes pulsers, such as switches, for generating waveforms. Transmit and/or receive beamforming components may be included, such as delays, phase rotators, amplifiers, summers, or other components for relatively delaying and apodizing transmit and receive apertures. For receive beamforming, summation may be used to partially beamform for a sub-aperture of the array of elements 58. In other examples, the semiconductor includes a mixer, or switches with an amplifier for mixing signals from different elements 58 onto fewer channels. The semiconductor may include circuitry other than for channel reduction, such as analog-to-digital converters, controllers, transmit/receive switching, and/or filtering.

The semiconductor is operable for a specific array and/or imaging system. For example, the semiconductor implements partial or sub-array beamforming for an array of elements 58 at a specific pitch for a given bandwidth and frequency of operation. Alternatively, the semiconductor is configurable to operate with different element pitches, imaging systems, frequencies, and/or bandwidths. By being configurable, the same semiconductor may operate with different arrays. Where multiple arrays are provided, the cost of producing the integrated circuit may be reduced since the same chip 44 may be used with any of the arrays.

The semiconductor is within the backing material, such as an integrated circuit embedded in the acoustically attenuating backing material. Backing material of the backing block 54 is between the semiconductor and the surface 72 or transducer material 54. For example, about 5-10 mm or other separation is provided. One side of the chip 44 is adjacent to or connects with the backing material. Backing material may also be adjacent one or two other sides, such as the sides connected with the one side. In one embodiment, the backing material is adjacent to or surrounds four sides of the chip 44. For the slices 50, the backing material is adjacent two sets of opposite sides. The other two sides are adjacent other chips, but separated by epoxy or one or more insulation layers. In other embodiments, backing material surrounds six sides or the entire chip 44. The backing material may extend entirely along the sides or be adjacent only a portion of one or more of the sides. Being "within" the backing block 54 may include at least a portion of the chip 44 being outside of or exposed on the edge of the backing block 54.

One chip 44 in the entire backing block 54 may be provided. In other embodiments, more than one chip 44 is embedded in the backing block 54. For example, the plurality of slices 50 make up the backing block 54. Each slice 50 includes one or more chips 44. Integrated circuits are provided in the backing block 54 for the elements 58 associated with each slice 50. For example, each slice 50 is aligned with a row of elements 58 in the azimuth or elevation dimensions. The embedded integrated circuit of each slice 50 performs channel reduction for the respective row of elements 58.

The backing block 54 also includes a plurality of traces or conductors 46 within the acoustically attenuating backing material. The conductors 46 are deposited traces, such as associated with the slices 50. Alternatively, the conductors 46 are wires, flex material, or other device formed in the backing block 54 by molding or other process. The conductors 46 may include different portions, such as traces soldered to or connected with pads, wires, electrodes, or other conductor. The conductors 46 may include portions for exposure on a surface of the backing block 54 and portions for contacting input/output pads of the chip 44.

The conductors 46 connect the elements 58 or corresponding electrodes to the chip 44 or inputs of the integrated circuit. The conductors 46 extend from the semiconductor through or on the backing material to the elements 58. In one embodiment, the conductors 46 extend to the conductive surfaces 52 on the surface 72 of the backing block 54.

The conductors 46 redistribute from the element pitch of the conductive surfaces 52 to a pitch of inputs on the integrated circuit of the chip 44. The pitches are different, but may be the same. For example using the embodiment with slices 50, the conductive surfaces 52 are exposed on the surface 72 in a row. The conductors 46 connect the conductive surfaces 52 of each row to the respective semiconductor chip 44. The conductors 46 may fan in or out toward the chip 44. In a one-chip-per-slice solution, the conductors 46 may fan out to accommodate a larger chip. Since different patterns of the conductors 46 may be used, the same chip 44 may be used with different element pitches. Different chips 44 may be used with the same element pitch.

Figure 15:
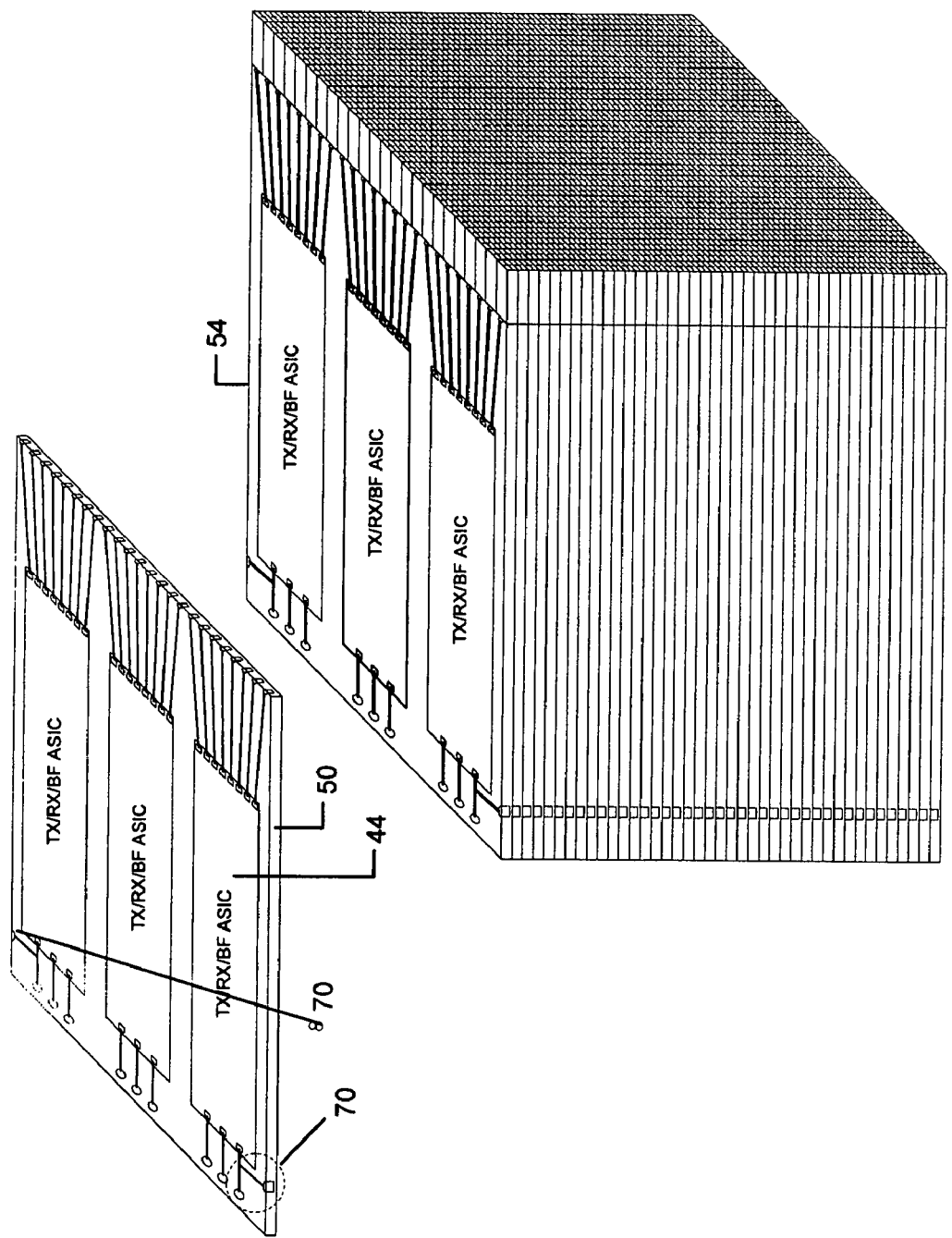
FIGS. 15 and 16 show alternative embodiments of conductor routing in a transducer array.
Figure 16:
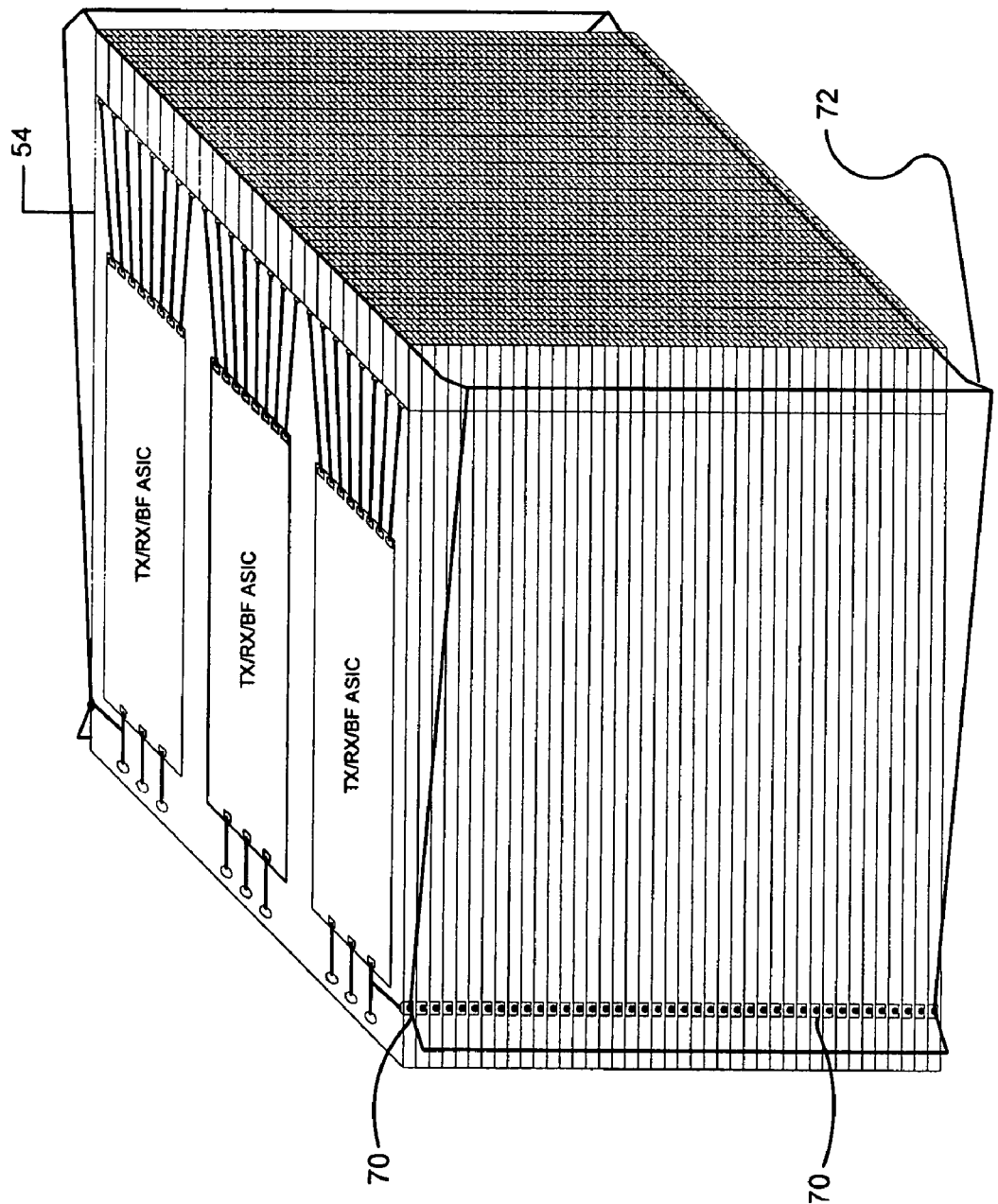

Other conductors 46 extend from the semiconductor through or on the backing material to a back of the backing block 54, but may extend to a side. Four surfaces are available for contact to the slices. The transducer array side and the system interconnect side are the primary surfaces, but all four surfaces of the block 54 that are orthogonal to the slices may have contacts. For example, FIGS. 15 and 16 show grounding contacts 70 on the sides of the slices 50 that can be used for grounding of the array or for other purposes. As another example, the conductors 46 for the power to the chip 44, control signals for the chip 44, or outputs from the chip 44 extend to the surface opposite the transducer material 56. Due to the combination of channels performed by the integrated circuit, a fewer number of conductors 46 may be provided.

FIGS. 15 and 16 show side contacts 70. The contacts 70 connect to other conductors 46 and/or to the chip 44. In one embodiment, the contacts 70 are for grounding. FIG. 16 shows a wrap-around conductive film 72 for grounding the front face of the array 56. The conductive film 72 is connected to the contacts 70 by pressure, conductive glue, solder bump, or other process. The contacts 70 may be on one or two sides. In other embodiments, one or more side contacts 70 are for electrically grounding the block 54 to an external shield. No or multiple contacts 70 on the side may be used.

Figure 13:
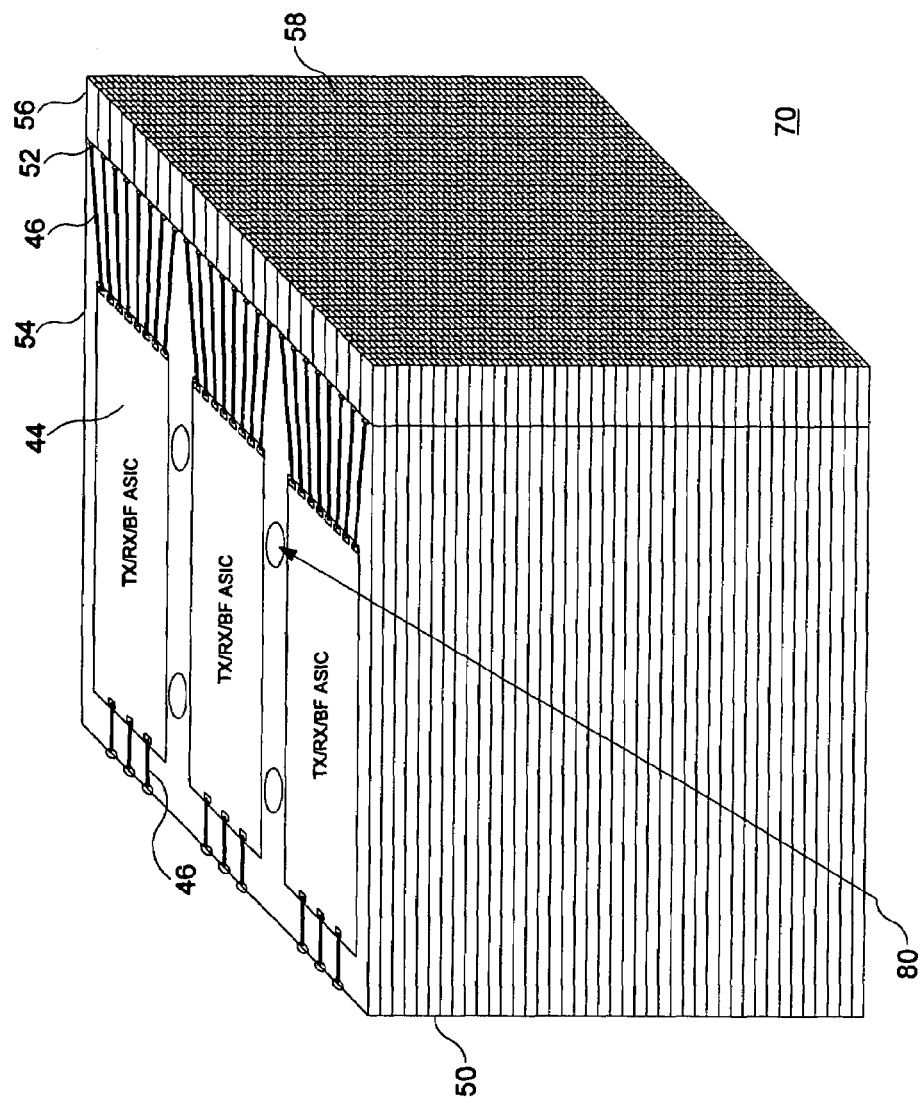
FIG. 13 shows one embodiment of a transducer array with cooling channels in the backing.

FIG. 13 shows another embodiment of the transducer 70 with cooling. The transducers 70 include one or more tubes 80 in the backing block 54. The tubes 80 extend through or only partially into the backing block 54. The tubes 80 are formed after stacking and laminating, or are formed by holes separately created in each slice 50. The tubes 80 are straight, but may interconnect or be angled. The tubes 80 are hollow. Forced gas or fluid passes through the tubes 80 for active cooling. Alternatively, passive cooling is provided. The tubes 80 may or may not be lined. In alternative or additional embodiments, the tubes 80 are filled with thermally conductive material, such as metal. The filler conducts heat away from the chips 44 to a thermal drain or pump.

Figure 14:
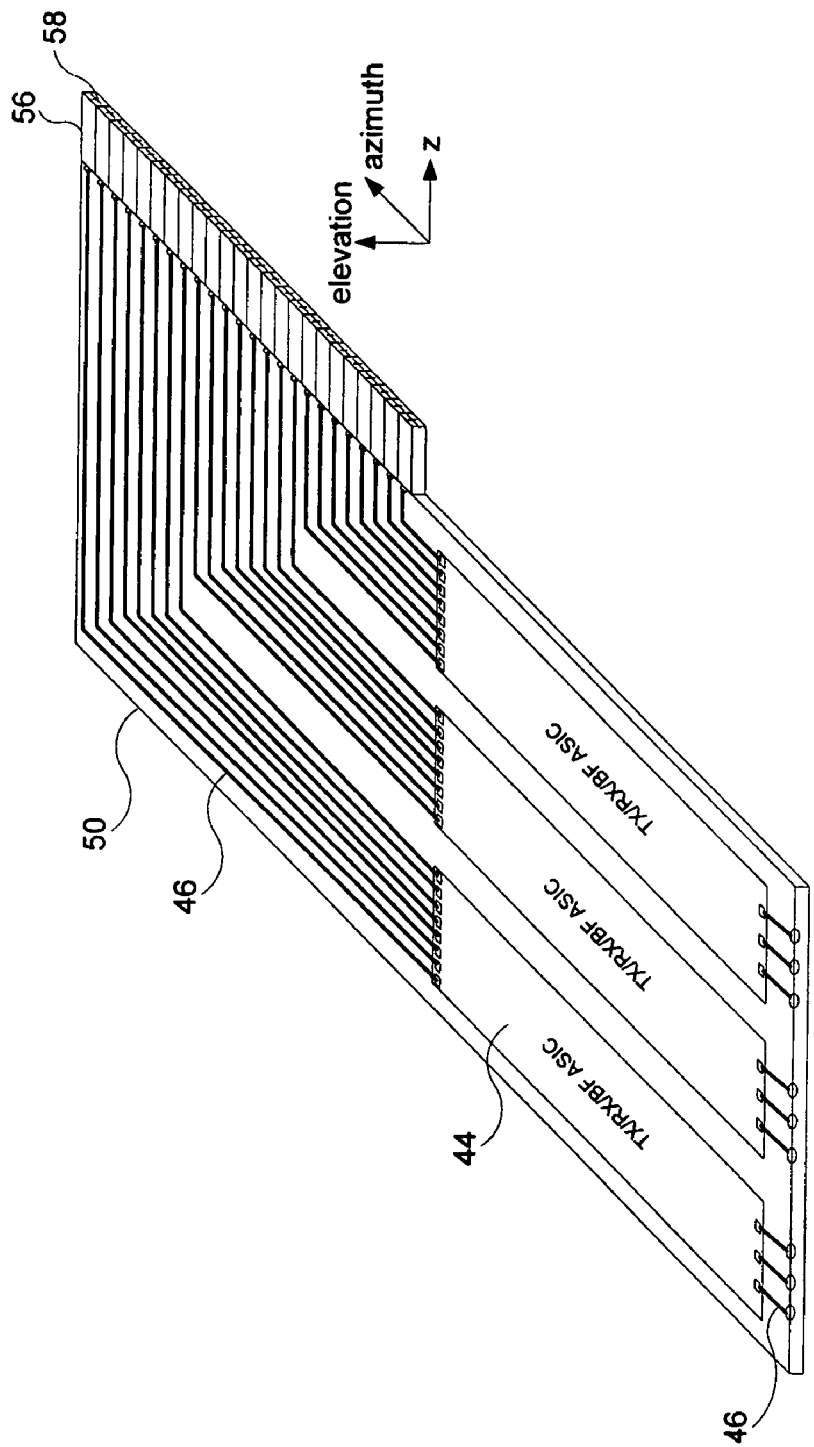
FIG. 14 shows one embodiment of a slice for use in an array of a transesophageal probe.

FIG. 14 shows another embodiment of a slice 50. Where the space behind the transducer material 56 and elements 58 is limited, such as in a transesophageal probe, the chips 44 may be positioned elsewhere within the backing material. The conductors 46 allow routing of the signals from the elements 58. The slice 50 is formed with the transducer material 56 as shown. Alternatively, the slice 50 is formed without transducer material 56, and the material 56 is added after stacking.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. In an ultrasound transducer having transducer material forming a plurality of elements, electrodes on each of the elements, and an acoustically attenuating backing material, an improvement comprising:

an integrated circuit embedded in the acoustically attenuating backing material;

wherein the acoustically attenuating backing material comprises a plurality of slices, a first one of the slices having the integrated circuit, and the other slices having other integrated circuits, the integrated circuits being in holes of the respective slices such that the integrated circuits are surrounded on at least four sides by the acoustically attenuating backing material of the slices;

wherein a plurality of traces within the acoustically attenuating backing material connect the integrated circuit to the electrodes, the plurality of traces corresponding to a respective plurality of elements, the traces of the slices connecting from an element pitch to an integrated circuit input pitch, the element pitch different than the integrated circuit pitch;

wherein the integrated circuit comprises at least a portion of a receive beamformer, a sub-array beamformer, a mixer or combinations thereof such that a number of receive traces output at the integrated circuit is less than the number of elements.

2. The improvement of claim 1 wherein the integrated circuit comprises an application specific integrated circuit.

3. The improvement of claim 2 wherein the application specific integrated circuit comprises at least a portion of a transmit beamformer, a receive beamformer, transmitter, sub-array beamformer, multiplexer, mixer, or combinations thereof.

4. The improvement of claim 1 wherein the integrated circuit comprises a configurable integrated circuit operable with different element pitches and imaging systems.

5. The improvement of claim 1 wherein the acoustically attenuating backing material is between a first side of the integrated circuit and the transducer material and is adjacent at least second and third sides of the integrated circuit.

6. The improvement of claim 5 wherein the acoustically attenuating backing material is adjacent a fourth side of the integrated circuit, the fourth side opposite the first side, and the second side opposite the third side.

7. The improvement of claim 1 wherein the elements comprise a multi-dimensional arrangement in elevation and azimuth;
wherein each of the slices is aligned with a row of elements in the azimuth or elevation dimensions.

8. The improvement of claim 1 wherein the acoustically attenuating backing material comprises loaded epoxy.

9. A backing for acoustic attenuation of energy from a backside of a transducer, the backing comprising:
    backing material having a first surface for contact with the back side of the transducer; and
    a semiconductor having active circuitry, the semiconductor within the backing material;
    a first plurality of conductors extending from the semiconductor through or on the backing material to a first plurality of conductive surfaces parallel with and exposed on the first surface, the first plurality of conductors connecting from an element pitch to an integrated circuit input pitch, the element pitch different than the integrated circuit pitch;
    a second plurality of conductors extending from the semiconductor through or on the backing material to a second surface opposite the first surface, the second plurality being fewer than the first plurality due to the active circuitry comprising at least a portion of a receive beamformer, a sub-array beamformer, a mixer, or combinations thereof.

10. The backing of claim 9 wherein the semiconductor comprises at least a portion of a transmit beamformer, a receive beamformer, transmitter, sub-array beamformer, multiplexer, mixer, or combinations thereof, the active circuitry being configurable for different element pitches and imaging systems.

11. The backing of claim 9 wherein the backing material is between a first side of the semiconductor and the first surface, and is adjacent at least second and third sides of the semiconductor.

12. The backing of claim 9 wherein the backing material comprises a plurality of slices, a first one of the slices having the semiconductor, and other slices having other semiconductors, each one of the slices of the plurality having conductors exposed on the first surface in a row, the conductors being distributed in a multi-dimensional pattern of a plurality of rows, wherein a plurality of traces connect the conductors of each row to the respective semiconductor.

13. The backing of claim 9 wherein the backing material comprises loaded epoxy.

* * * * *